(12) United States Patent
Ueda et al.

(10) Patent No.: US 8,845,942 B2
(45) Date of Patent: Sep. 30, 2014

(54) COMPACT PRODUCTION APPARATUS AND METHOD FOR PRODUCING COMPACT

(75) Inventors: Shigehisa Ueda, Tokyo (JP); Kazuo Noda, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 36 days.

(21) Appl. No.: 13/637,032

(22) PCT Filed: Mar. 1, 2011

(86) PCT No.: PCT/JP2011/054587
§ 371 (c)(1),
(2), (4) Date: Sep. 25, 2012

(87) PCT Pub. No.: WO2011/122202
PCT Pub. Date: Oct. 6, 2011

(65) Prior Publication Data
US 2013/0015607 A1    Jan. 17, 2013

(30) Foreign Application Priority Data

Mar. 30, 2010  (JP) .............................. 2010-078896

(51) Int. Cl.
| | | |
|---|---|---|
| *B29C 43/08* | (2006.01) | |
| *B30B 11/08* | (2006.01) | |
| *B30B 11/10* | (2006.01) | |
| *B29C 43/36* | (2006.01) | |
| *H01L 21/56* | (2006.01) | |
| *B29C 43/18* | (2006.01) | |
| *H01L 23/31* | (2006.01) | |
| *H01L 23/00* | (2006.01) | |
| *B29K 105/00* | (2006.01) | |

(52) U.S. Cl.
CPC ....... *B30B 11/10* (2013.01); *H01L 2224/73265* (2013.01); *H01L 2224/48091* (2013.01); *B29C 43/361* (2013.01); *H01L 2224/32225* (2013.01); *H01L 24/48* (2013.01); *H01L 2224/32245* (2013.01); *H01L 2224/48245* (2013.01); *H01L 21/56* (2013.01); *B29C 43/18* (2013.01); *H01L 2924/01079* (2013.01); *H01L 23/3107* (2013.01); *B29C 43/08* (2013.01); *H01L 2224/48247* (2013.01); *B29K 2105/251* (2013.01); *H01L 2224/48465* (2013.01)
USPC ............ 264/123; 264/109; 425/352; 425/353

(58) Field of Classification Search
None
See application file for complete search history.

(56) References Cited

U.S. PATENT DOCUMENTS

| | | | | |
|---|---|---|---|---|
| 4,197,066 | A * | 4/1980 | Kennedy .......................... | 425/77 |
| 4,225,300 | A * | 9/1980 | Latter .............................. | 425/77 |
| 6,106,267 | A * | 8/2000 | Aylward ........................ | 425/352 |
| 6,227,836 | B1 * | 5/2001 | Kato et al. ....................... | 425/89 |
| 6,787,082 | B1 * | 9/2004 | Fukuyama et al. ............ | 264/109 |
| 2002/0175439 | A1 * | 11/2002 | Kohara et al. ................ | 264/102 |
| 2003/0194463 | A1 * | 10/2003 | Gakovic ........................ | 425/352 |
| 2005/0040561 | A1 |  2/2005 | Kubo et al. | |
| 2006/0013914 | A1 |  1/2006 | Shimada et al. | |
| 2006/0216347 | A1 * | 9/2006 | Stroppolo et al. ............. | 424/464 |
| 2008/0092706 | A1 |  4/2008 | Harada et al. | |
| 2011/0187016 | A1 * | 8/2011 | Gulliver ........................ | 264/109 |

FOREIGN PATENT DOCUMENTS

| | | |
|---|---|---|
| CN | 1551820 A | 12/2004 |
| CN | 1604843 A | 4/2005 |
| JP | 6-277770 A | 10/1994 |
| JP | 7-236998 A | 9/1995 |
| JP | 8-192295 A | 7/1996 |
| JP | 11-290806 A | 10/1999 |
| JP | 2000-52328 A | 2/2000 |
| JP | 2002-301597 A | 10/2002 |
| JP | 2006-88211 A | 4/2006 |
| WO | WO 2006/022290 A1 | 3/2006 |

OTHER PUBLICATIONS

International Search Report, issued in PCT/JP2011/054587, dated May 10, 2011.
Office Action mailed Feb. 18, 2014, in Japanese Patent Application No. 2010-078896,with English translation.

Chinese Office Action for corresponding Application No. 201180013982.2 dated Mar. 26, 2014.

\* cited by examiner

*Primary Examiner* — Mary F Theisen
(74) *Attorney, Agent, or Firm* — Birch, Stewart, Kolasch & Birch, LLP

(57) ABSTRACT

A compact production apparatus includes a main body having at least one molding die in which a cavity is formed, a first flow passage member for supplying powder into the cavity, an upper compaction member having an upper punch surface, a lower compaction member having a lower punch surface which is allowed to compress the powder in the cavity in cooperation with the upper punch surface to thereby obtain a compact of the powder, and a second flow passage member from which the compact separated from the cavity is to be discharged. Further, at least 80% or more of a total surface area of an upper surface of the main body, an inner circumferential surface defining the cavity, an inner circumferential surface of the first flow passage member, an inner circumferential surface of the second flow passage member, the upper punch surface of the upper compaction member and the lower punch surface of the lower compaction member is made of a nonmetallic material.

15 Claims, 6 Drawing Sheets

COMPACT PRODUCTION APPARATUS AND METHOD FOR PRODUCING COMPACT

The present invention relates to a compact production apparatus and a method for producing a compact.

BACKGROUND OF THE INVENTION

There is known a semiconductor package in which a semiconductor chip (semiconductor element) is covered (encapsulated) with a resin-made encapsulating (sealing) material. The encapsulating material for the semiconductor chip is formed of a resin composition and is produced by molding such a resin-made compact in the form of a resin-made compact through, e.g., a transfer molding method. In a process for producing the compact (resin-made compact), the resin composition as a base material is compressed (compression-molded) by a tablet-making apparatus (compact production apparatus) to thereby obtain (produce) the compact formed into a tablet (block) form (for example, see patent document 1). In the tablet-making apparatus, a part of the apparatus which makes contact with the resin composition is generally constituted of a metallic material. In case of using such an apparatus having the part constituted of the metallic material, there is a case that metal powder or the like is generated by friction between the metallic parts of the apparatus and/or between the part of the apparatus and the resin composition. In the invention described in the patent document 1, in the case where such powder is attached to the compact, the powder attached to the compact is blown off by air.

However, according to the invention of the patent document 1, the powder attached to the compact cannot be sufficiently removed only by blowing the air to the compact. For this reason, there is a case that a part of the powder remains on the compact to some degrees. If the remaining powder on the compact includes metal powder, the metal powder is contained in the compact as foreign substances. In the case where such compact containing metal powder is used as the encapsulating material for the semiconductor package, it is impossible to encapsulate the semiconductor chip in a state that the semiconductor chip is reliably insulated. As a result, there is a case that a short circuit occurs in the semiconductor chip.

Patent Document 1: JP-A 11-290806.

It is an object of the present invention to provide a compact production apparatus and a method for producing a compact, which are capable of reliably preventing metal powder from being contained in a compact when a resin composition which is a base material of the compact is compressed (compression-molded) for producing the compact.

The above object is achieved by the present invention which is specified in the following (1) to (15).

(1) A compact production apparatus for producing a compact by compression-molding a resin composition which is a base material of the compact, the compact production apparatus comprising:

a main body formed into a plate shape and configured to be rotatable around a central vertical axis thereof, the main body having at least one molding die in which a cavity having an upper opening and a lower opening vertically opposite to the upper opening is formed, the resin composition being supplied into the cavity, a first flow passage member formed into a tubular shape and constituting a first flow passage through which the resin composition is supplied into the cavity, the resin composition being supplied into the cavity through the first flow passage at a first position where the main body is rotated around the central vertical axis by a specified angle from an initial position, an upper compaction member having an upper punch surface to be inserted into the upper opening of the cavity from an upper side thereof at a second position where the main body is rotated around the central vertical axis by a specified angle from the first position, the upper punch surface allowed to compress the resin composition in the cavity, a lower compaction member having a lower punch surface to be inserted into the lower opening of the cavity from a lower side thereof at the second position, the lower punch surface allowed to compress the resin composition in the cavity in cooperation with the upper punch surface of the upper compaction member to thereby produce the compact, and a second flow passage member formed into a tubular shape and constituting a second flow passage through which the compact is discharged from the cavity, wherein the compact obtained by compressing the resin composition is separated from the cavity at a third position where the main body is rotated around the central vertical axis by a specified angle from the second position and then the compact separated from the cavity is discharged through the second flow passage, wherein at least 80% or more of a total surface area of an upper surface of the main body, an inner circumferential surface defining the cavity, an inner circumferential surface of the first flow passage member, an inner circumferential surface of the second flow passage member, the upper punch surface of the upper compaction member and the lower punch surface of the lower compaction member is constituted of a nonmetallic material.

(2) The compact production apparatus described above (1), wherein the nonmetallic material is a ceramic material or a resin material.

(3) The compact production apparatus described above (2), wherein the ceramic material contains an oxide ceramic.

(4) The compact production apparatus described in any one of above (1) to (3), wherein a Vickers hardness Hv defined by JIS Z 2244 of the nonmetallic material measured at a load of 500 gf is equal to or more than 1300.

(5) The compact production apparatus described in any one of above (1) to (4), wherein the upper surface of the main body, the inner circumferential surface defining the cavity, the upper punch surface of the upper compaction member and the lower punch surface of the lower compaction member are constituted of the same nonmetallic material.

(6) The compact production apparatus described in any one of above (1) to (5), wherein the inner circumferential surface of the first flow passage member and the inner circumferential surface of the second flow passage member are constituted of the same or different nonmetallic material.

(7) The compact production apparatus described in any one of above (1) to (6), wherein the nonmetallic material is formed into a coating film containing the nonmetallic material.

(8) The compact production apparatus described above (7), wherein a thickness of the coating film is in the range of 0.2 to 1.0 mm.

(9) The compact production apparatus described in any one of above (1) to (8), wherein the cavity is formed into a cylindrical shape.

(10) The compact production apparatus described in any one of above (1) to (9), wherein each of the upper punch surface of the upper compaction member and the lower punch surface of the lower compaction member is formed into a planar shape or a curved concave shape.

(11) The compact production apparatus described in any one of above (1) to (10), wherein at least a part of each of the inner circumferential surface of the first flow passage member and the inner circumferential surface of the second flow passage member is inclined downwardly.

(12) The compact production apparatus described in any one of above (1) to (11), wherein a releasing agent is previously applied to each of the inner circumferential surface defining the cavity, the upper punch surface of the upper compaction member and the lower punch surface of the lower compaction member.

(13) The compact production apparatus described in any one of above (1) to (12), wherein the resin composition is formed into powder.

(14) The compact production apparatus described in any one of above (1) to (13), wherein the resin composition is used as a molding portion constituting an outer packaging of an IC package.

(15) A method for producing a compact comprising: compression-molding a resin composition which is a base material of the compact by using the compact production apparatus described in any one of above (1) to (14) to thereby produce the compact.

DETAILED DESCRIPTION OF THE PREFERRED EMBODIMENT

Hereinbelow, a compact production apparatus and a method for producing a compact according to the present invention will be described in detail based on the preferred embodiments shown in the accompanying drawings.

Figure 1:
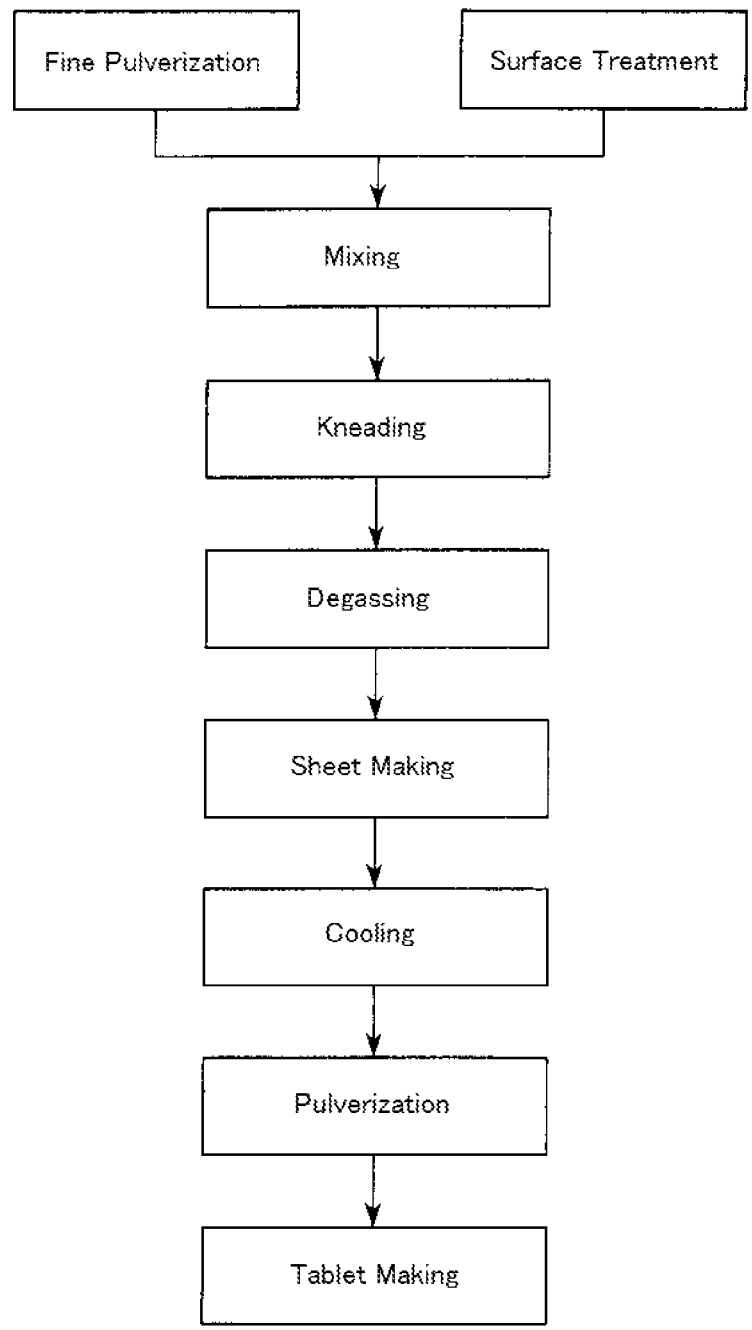
FIG. 1 is a process chart showing a producing process of a resin composition.
Figure 2:
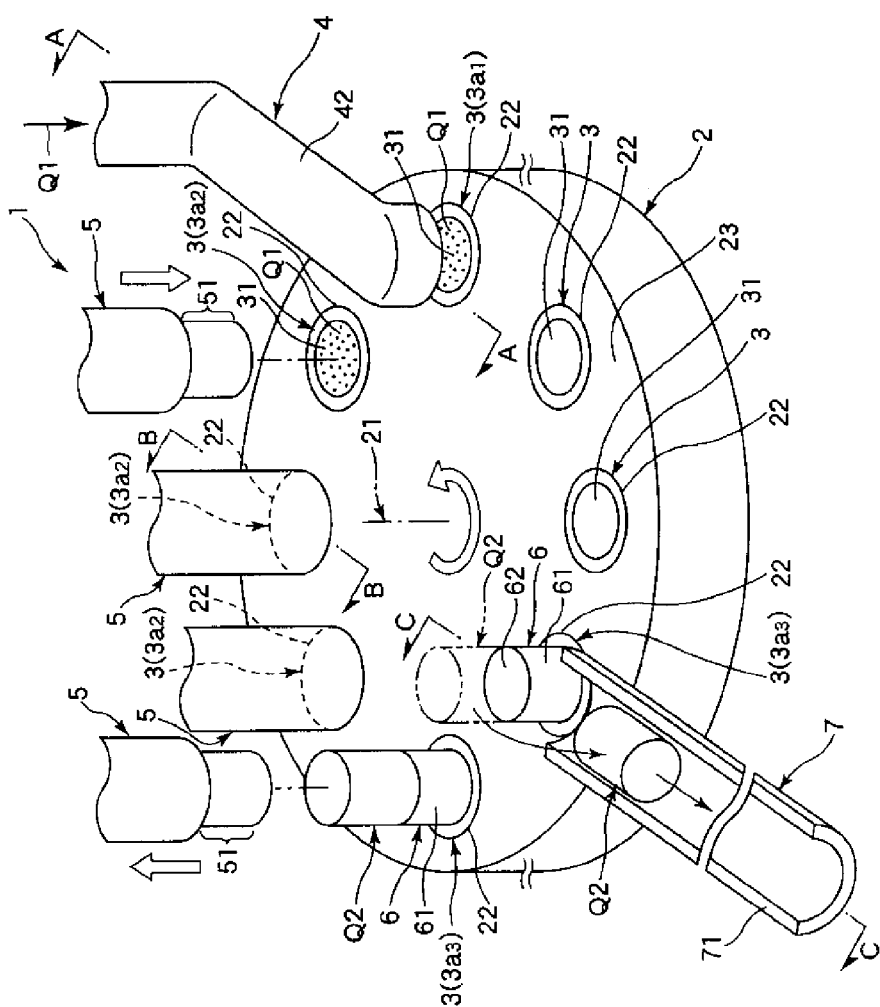
FIG. 2 is a perspective view schematically showing a compact production apparatus according to the present invention.
Figure 3:
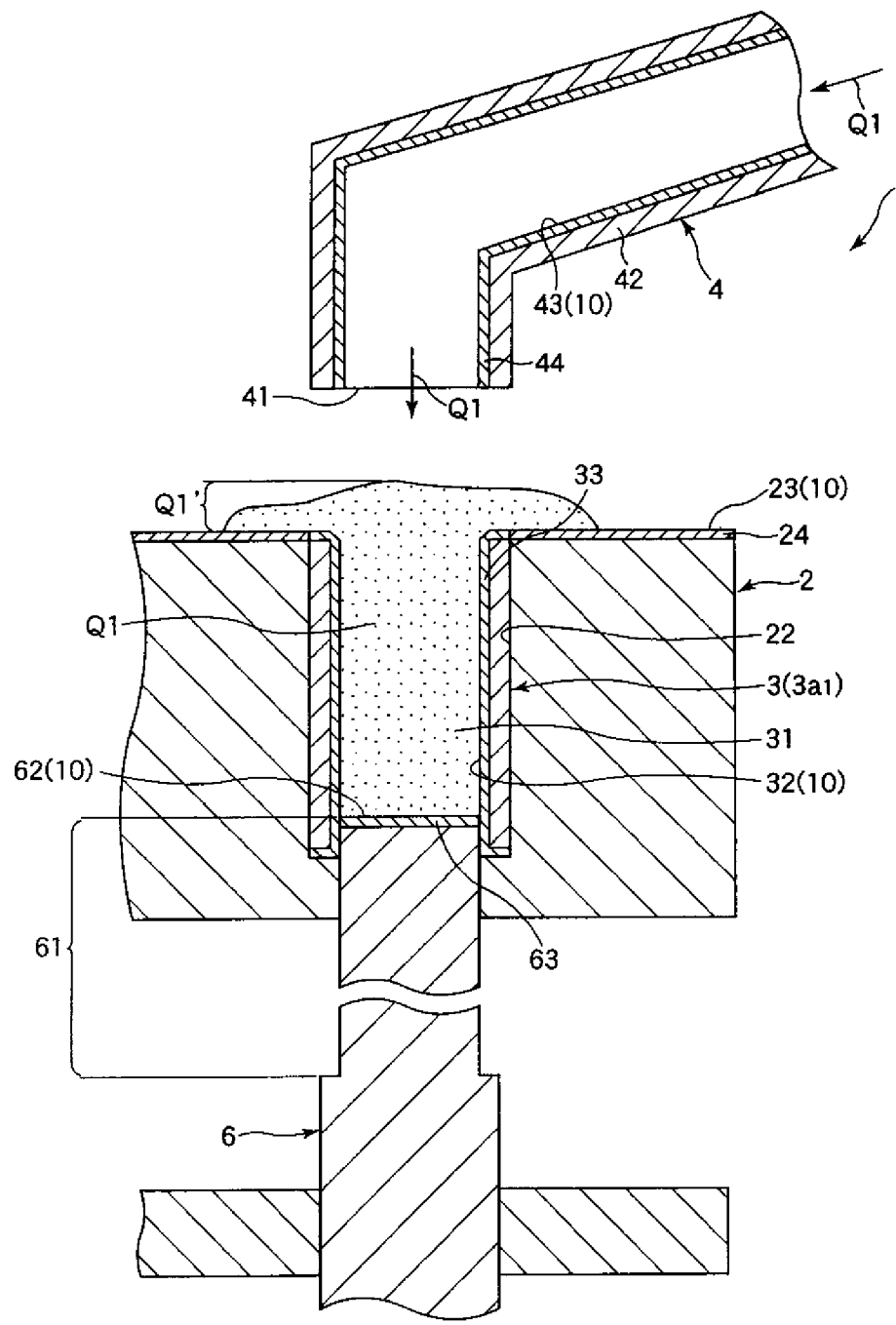
FIG. 3 is a cross section view along a line A-A in FIG. 2.
Figure 4:
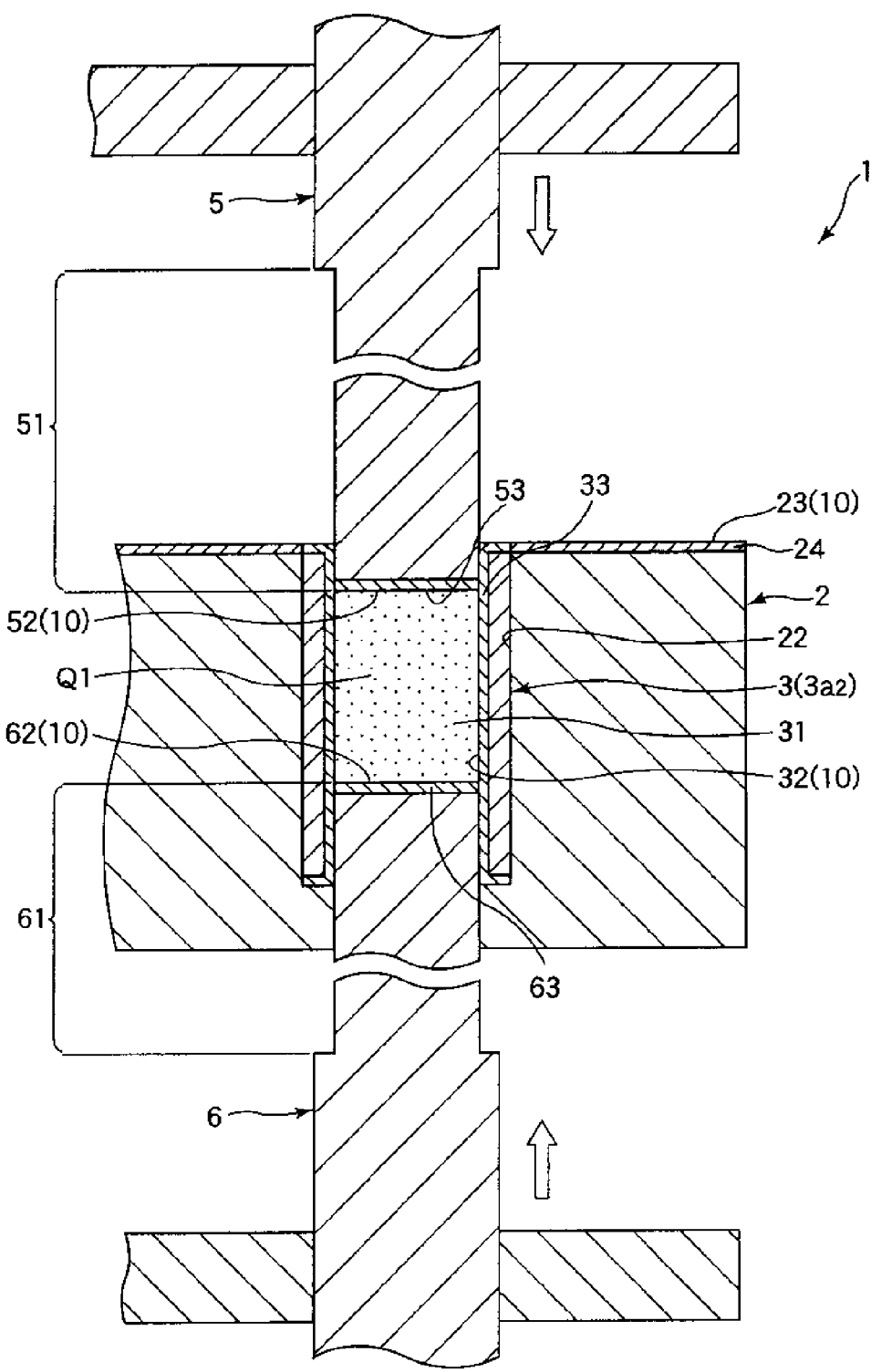
FIG. 4 is a cross section view along a line B-B in FIG. 2.
Figure 5:
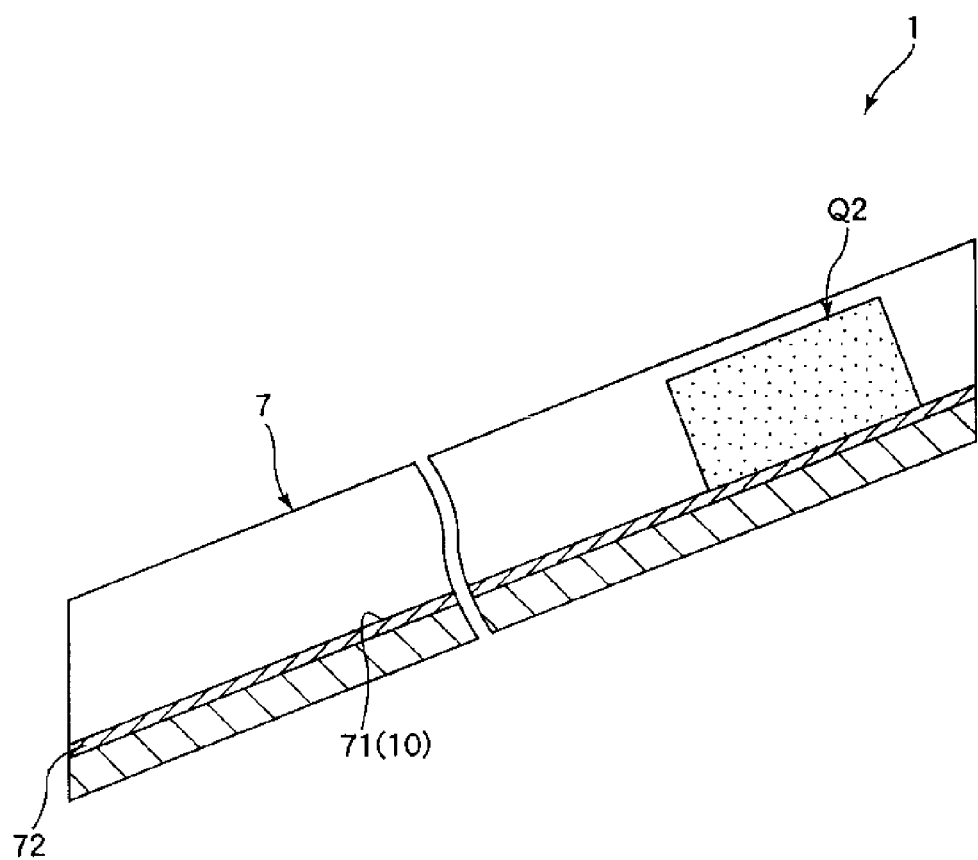
FIG. 5 is a cross section view along a line C-C in FIG. 2.
Figure 6:
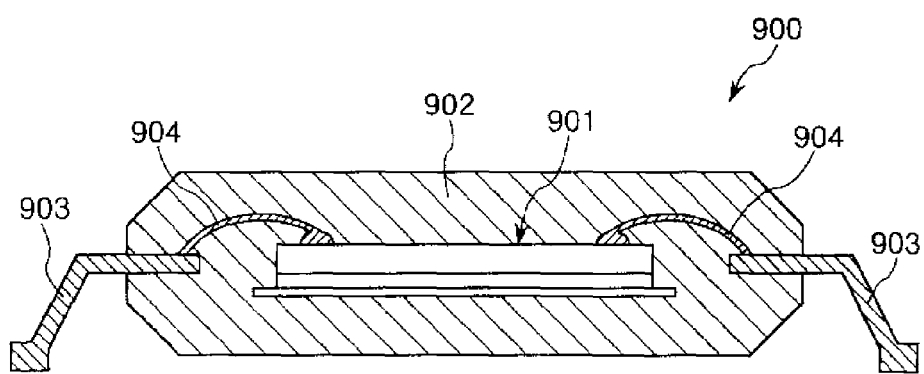
FIG. 6 is a partial section view showing an IC package using the resin composition.

FIG. 1 is a process chart showing a producing process of a resin composition. FIG. 2 is a perspective view schematically showing a compact production apparatus according to the present invention. FIG. 3 is a cross section view along a line A-A in FIG. 2. FIG. 4 is a cross section view along a line B-B in FIG. 2. FIG. 5 is a cross section view along a line C-C in FIG. 2. FIG. 6 is a partial section view showing an IC package using the resin composition. In the following description, the upper side in FIGS. 2 to 6 will be referred to as "upper" or "upper side" and the lower side will be referred to as "lower" or "lower side".

A compact production apparatus (tablet-making apparatus) 1 shown in FIG. 2 is an apparatus used in a tablet-making process for producing a compact from a resin composition. Prior to describing the compact production apparatus 1, description will be first made on the overall producing process which begins with the supply of raw materials and ends with the production of the resin composition for encapsulating a semiconductor chip (semiconductor element).

At first, individual materials as raw materials of the resin composition are prepared.

The raw materials include a resin, a curing agent and a filler material (fine particles). If necessary, the raw materials may further include a curing accelerator and a coupling agent. It is preferable to use an epoxy resin as the resin.

Examples of the epoxy resin include a cresol novolac type epoxy resin, a biphenyl type epoxy resin, a dicyclopentadiene type epoxy resin, a triphenol methane type epoxy resin and a multi-ring aromatic type epoxy resin.

Examples of the curing agent include a phenol novolac type resin, a phenol aralkyl type resin, a triphenol methane type resin and a multi-ring aromatic resin.

Examples of the filler material include a fused silica (having a crushed shape or a spherical shape), a crystalline silica and an alumina.

Examples of the curing accelerator include a phosphor compound and an amine compound. Examples of the coupling agent include a silane compound and so forth.

Specific one of the materials stated above may be excluded from the raw materials. Other materials than set forth above may be further included in the raw materials. Examples of the other materials include a coloring agent, a releasing agent, a stress-reducing agent and a flame retardant.

Examples of the flame retardant include a brominated epoxy resin, an antimony oxide based flame retardant, non-halo and non-antimony based flame retardant. Examples of the non-halo and non-antimony based flame retardant include organic phosphor, metal hydrate and a nitrogen-containing resin.

(Fine Pulverization)

As shown in FIG. 1, specific materials among the raw materials are first pulverized (finely pulverized) by a first pulverizing apparatus such as a continuous rotary ball mill and so forth to have a specified particle size distribution. Examples of the raw materials to be pulverized include the resin, the curing agent, the curing accelerator and other materials than the filler material. A part of the filler material may be added into the raw materials to be pulverized.

(Surface Treatment)

A specified material among the raw materials, for example, all or a part (remaining part) of the filler material, is subjected to a surface treatment. In the surface treatment, for example, the coupling agent is allowed to adhere to surfaces of the filler material. The fine pulverization and the surface treatment may be performed either simultaneously or one after the other.

(Mixing)

Next, the above raw materials are mixed thoroughly by a mixing device to obtain a mixed composition. As the mixing device, it is possible to use, for example, a high-speed mixing device having rotary blades.

(Kneading)

Next, the mixed composition is kneaded by a kneading apparatus. As the kneading apparatus, it is possible to use, a kneading extruder such as a single-axis type kneading extruder or a double-axis type kneading extruder, or a roll type kneader such as a mixing roll and so forth.

(Degassing)

Next, the mixed composition thus kneaded (resin composition) is degassed by a degassing device. This degassing process can be performed by a vacuum pump connected with a discharge passage of the kneading apparatus. The discharge passage of the kneading apparatus discharges the resin composition thus kneaded.

(Sheet Making)

Next, the resin composition thus degassed is molded into a sheet shape by a sheet-making device. As a result, a sheet shaped resin composition (sheet shaped resin material) is obtained. As the sheet-making device, it is possible to use, e.g., a device having a pair of rollers in which the resin composition is molded into a sheet shape by pressurizing the resin composition between the pair of rollers.

(Cooling)

Next, the sheet shaped resin composition is cooled by a cooling device. This makes it possible to easily and reliably perform pulverization of the sheet shaped resin composition in the subsequent step.

(Pulverization)

Next, the sheet shaped resin composition is pulverized by a second pulverizing apparatus to have a specified particle size distribution. As a result, a pulverized resin composition (hereinbelow referred to as "resin powder Q1") is obtained. As the second pulverizing apparatus, it is possible to use, e.g., a hammer mill, a knife mill or a pin mill.

In this regard, the resin powder Q1 may be obtained not by way of the sheet-making, cooling and pulverizing steps. Instead, the resin powder Q1 may be obtained by, e.g., a hot cutting method in which a die having a small diameter is installed in an outlet port (discharge passage) of the kneading apparatus and a molten resin composition discharged from the die is cut by a cutter into granular resin composition having a specified length. After obtaining the granular resin composition by the hot cutting method, it is preferable to perform degassing while the temperature of the resin composition remains high.

(Tablet Making)

Next, a large quantity of the resin powder Q1 is compression-molded by using a compact production apparatus 1 to thereby easily and reliably obtain a compact Q2 made of the resin powder Q1.

As shown in FIG. 6, the compact Q2 is used for, for example, covering (encapsulating) a semiconductor chip (IC chip) 901. Namely, the compact Q2 is used as a molding portion 902 constituting an outer packaging of a semiconductor package (IC package) 900. This makes it possible to protect the semiconductor chip 901 with the molding portion 902. In order to encapsulate the semiconductor chip 901 with the resin composition in the form of the compact Q2, the resin composition in the form of the compact Q2 is molded by a transfer molding method and so forth, and then the semiconductor chip 901 is encapsulated with the resin composition. The semiconductor package 900 shown in FIG. 6 has plural lead frames 903 protruding from the molding portion 902. Each of the lead frames 903 is electrically connected with the semiconductor chip 901 through a wire 904 constituted of a metallic material having conductive property, such as gold and so forth.

Next, description will be made on the compact production apparatus 1. As shown in FIG. 2, the compact production apparatus 1 is an apparatus which performs a method for producing a compact of the present invention. Namely, the compact production apparatus 1 is used for producing the compact Q2 by compression-molding the resin powder Q1 (pulverized resin composition) which is a base material of the compact Q2.

The compact production apparatus 1 comprises a main body 2, plural dies 3 (in the configuration shown in FIG. 2, eight) provided in the main body 2, a first flow passage member 4 constituting a first flow passage through which the resin powder Q1 is supplied to the plural dies 3, an upper compaction member 5 for compressing the resin powder Q1 in the plural dies 3, a lower compaction member 6 for compressing the resin powder Q1 in the plural dies 3 in cooperation with the upper compaction member 5 to thereby produce the compact Q2, and a second flow passage member 7 constituting a second flow passage through which the compact Q2 obtained (produced) by compressing the resin powder Q1 is discharged. Hereinbelow, the configuration of the respective components of the compact production apparatus 1 will be representatively described.

The main body 2 is formed into a disk shape as a whole. The main body 2 has a central axis 21 and is provided at the compact production apparatus 1 such that the central axis 21 thereof is parallel to a vertical direction of the compact production apparatus 1. The main body 2 is configured to be rotatable around the central axis 21 (vertical axis). In this regard, for example, the main body 2 is connected to a rotation mechanism for rotating the main body 2 having a gear and a motor (not shown in the drawings).

The main body 2 has fixing portions 22 in which each of the eight dies 3 is provided and fixed. The fixing portions 22 are arranged in the main body 2 at an equal angular interval around the central axis 21 of the main body 2. Further, as shown in FIGS. 3 and 4, each of the fixing portions 22 includes a through hole having an opening at an upper surface 23 of the main body 2. The shape of the fixing portion 22 is formed into a shape corresponding to an outer peripheral shape of the die 3, that is, a cylindrical shape in the configuration shown in the drawings.

Hereinbelow, since configurations of the eight dies 3 are identical to each other, one of the dies 3 will be representatively described.

As shown in FIGS. 2 to 4, the die 3 is formed into the cylindrical shape and has an upper opening and a lower opening vertically opposite to the upper opening. A hollow portion defined by an inner circumferential surface of the die 3 constitutes a cavity 31. The resin powder Q1 is supplied (filled) into the cavity 31 and then is compression-molded. As a result, the compact Q2 formed into a column shape is obtained (see FIG. 1). Since the compact Q2 is formed into such a simple shape, the compact Q2 is hard to be damaged.

Further, the inner circumferential surface 32 (wall surface) defining the cavity 31 of the die 3 has a circular shape in cross section. Thus, when a releasing agent is applied to the inner circumferential surface 32, it is possible to easily perform the application of the releasing agent thereto. Further, this makes it possible for the releasing agent to be reliably applied to the whole inner circumferential surface 32. In addition, by previously applying the releasing agent to the inner circumferential surface 32, it is possible to easily separate the compact Q2 from the cavity 31. Examples of the releasing agent include a silicone type releasing agent such as organopolysiloxane and the like, a fluorine type releasing agent such as polytetrafluoroethylene and the like, an alcohol type releasing agent such as polyvinyl alcohol and the like, a wax such as a paraffin, a higher fatty acid, a higher fatty acid metal, an ester type wax, a polyolefin type wax, polyethylene, polyethylene oxide, and the like. These materials may be used singly or in combination of two or more of them.

As shown in FIGS. 2 and 4, the upper compaction member 5 is formed into a long cylindrical shape and compresses the resin powder Q1 in the cavity 31 of the die 3.

The upper compaction member 5 is movably supported by a moving mechanism (not shown in the drawings) in the vertical direction thereof. Thus, the upper compaction member 5 can be inserted into the cavity 31 from an upper side thereof. On the contrary, the upper compaction member 5 can be removed from the cavity 31. The moving mechanism for moving the upper compaction member 5 is not limited to a specific type, but examples of the moving mechanism include a mechanism having an oil hydraulic cylinder.

Further, the upper compaction member 5 has an insertion portion 51 to be inserted into the cavity 31. An outer diameter of the insertion portion 51 is slightly smaller than an inner diameter of the die 3. A lower surface of the upper compaction member 5 constitutes an upper punch surface 52 (compressing surface) which is allowed to compress the resin powder Q1 in the cavity 31 from an upper side of the cavity 31 (see FIG. 4). The upper punch surface 52 is formed into a planar shape. Since the upper punch surface 52 is formed into such a simple shape, for example, it is possible to easily perform the application of the releasing agent to the upper punch surface 52. Further, this makes it possible to reliably apply the releasing agent to the whole upper punch surface 52. In addition, by previously applying the releasing agent to the upper punch surface 52, it is possible to easily separate the compact Q2 from the cavity 31. In this regard, the upper punch surface 52, depending on the shape of the compact Q2 to be produced, may not be necessarily formed into the planar shape.

As shown in FIGS. 3 and 4, the lower compaction member 6 is formed into a long cylindrical shape and compresses the resin powder Q1 in the cavity 31 of the die 3 in cooperation with the upper compaction member 5.

The lower compaction member 6 is movably supported by a moving mechanism (not shown in the drawings) in the vertical direction thereof. Thus, the lower compaction member 6 can be inserted into the cavity 31 from a lower side thereof. Further, an insertion length of the lower compaction member 6 into the cavity 31 can be changed (see FIGS. 3 and 4). The moving mechanism for moving the lower compaction member 6 is not limited to a specific type, but examples of the moving mechanism include a mechanism having an oil hydraulic cylinder.

Further, the lower compaction member 6 has an insertion portion 61 to be inserted into the cavity 31. An outer diameter of the insertion portion 61 is slightly smaller than the inner diameter of the die 3. An upper surface of the lower compaction member 6 constitutes a lower punch surface 62 (compressing surface) which is allowed to compress the resin powder Q1 in the cavity 31 from a lower side of the cavity 31 (see FIG. 4). The lower punch surface 62 is formed into a planar shape. Since the lower punch surface 62 is formed into such a simple shape, for example, it is possible to easily perform the application of the releasing agent to the lower punch surface 62. Further, this makes it possible to reliably apply the releasing agent to the whole lower punch surface 62. By previously applying the releasing agent to the lower punch surface 62, it is possible to easily separate the compact Q2 from the cavity 31. In this regard, the lower punch surface 62, depending on the shape of the compact Q2 to be produced, may not be necessarily formed into the planar shape.

As shown in FIGS. 2 and 3, the first flow passage member 4 is used for supplying the resin powder Q1 into the cavity 31 of the die 3. The first flow passage member 4 constitutes a tubular body having a circular shape in cross section. The resin powder Q1 can be passed through a hollow portion of the tubular body constituting the first flow passage member 4.

The first flow passage member 4 has an opening portion opened downwardly. The opening portion of the first flow passage member 4 serves as a discharge passage 41 from which the resin powder Q1 is discharged. When the die 3 is positioned below the discharge passage 41, the resin powder Q1 is discharged from the discharge passage 41 and supplied into the cavity 31 of the die 3.

Further, the first flow passage member 4 has an inclined portion 42 that is inclined at the middle of a longitudinal direction of the first flow passage member 4. In the inclined portion 42, since a part of an inner circumferential surface 43 of the first flow passage member 4 is inclined downwardly, it is possible for the resin powder Q1 to easily flow down through the first flow passage member 4. This makes it possible to rapidly supply the resin powder Q1 into the die 3.

As shown in FIG. 2, the second flow passage member 7 is provided in a circumferential direction of the main body 2 and arranged in a different position from the first flow passage member 4. The compact Q2 discharged (separated) from the cavity 31 of the die 3 is to be passed through the second flow passage member 7. The second flow passage member 7 constitutes a tubular body having a semi-circular shape in cross section.

Further, as shown in FIG. 5, the whole second flow passage member 7 (inner circumferential surface 71) is inclined downwardly. This makes it possible for the compact Q2 to easily flow down through the second flow passage member 7. As a result, the compact Q2 can be rapidly collected. In this regard, for example, a collecting tray (not shown in the drawings) for collecting the plural compacts Q2 is provided in the lower side of the second flow passage member 7. This makes it possible for the plural compacts Q2 to be conveyed together.

Next, description will be made on a function of the compact production apparatus 1, that is, the process in which the compact Q2 is produced in each of the dies 3. Hereinbelow, for the sake of facilitating the understanding of the present invention, the description will be representatively made on the compact Q2 compressed in the "die $3_{a1}$" among the eight dies 3 positioned just below the discharge passage 41 of the first flow passage member 4 in the configuration shown in FIG. 2.

When the main body 2 is rotated in an anti-clockwise direction by a specified angle from an initial state (initial position), the die $3_{a1}$ is positioned just below the discharge passage 41 of the first flow passage member 4 at this position (hereinbelow referred to as "first position", see FIGS. 2 and 3). In the first position, the resin powder Q1 is supplied and filled into the cavity 31 of the die $3_{a1}$ from the first flow passage member 4 in a state that the lower compaction member 6 is partially inserted into the cavity 31. The resin powder Q1 is supplied and filled into the cavity 31 to an extent that the resin powder Q1 supplied into the cavity 31 is overflowed out of the cavity 31 (see FIG. 3). An excess resin powder Q1' overflowed out of the cavity 31 is removed before the resin powder Q1 is compression-molded. Thus, the resin powder Q1 is filled into the cavity 31 of the die $3_{a1}$ in just proportion, that is, a constant amount of the resin powder Q1 is filled into the cavity 31. In this regard, the removal of the excess resin powder Q1' is performed by using, e.g., a scraper.

Next, when the main body 2 is rotated in an anti-clockwise direction by a specified angle (in the configuration shown in FIG. 2, 45°) from the first position, the die $3_{a1}$ is removed from the first flow passage member 4. The die $3_{a1}$ moved from the first position to this position is called as "die $3_{a2}$". In this position (hereinbelow referred to as "second position"), the die $3_{a2}$ is positioned just below the upper compaction member 5. Thereafter, as shown in FIG. 4, the upper compaction member 5 falls down and the lower compaction member 6 rises up so that the resin powder Q1 in the cavity 31 of the die $3_{a2}$ is compressed between the upper punch surface 52 of the upper compaction member 5 and the lower punch surface 62 of the lower compaction member 6. The compression state of the resin powder Q1 is maintained until the main body 2 is rotated to a third position described below. The resin powder Q1 is compressed during the main body 2 rotating from the second position to the third position, thereby becoming firm. As a result, the compact Q2 is obtained.

Thereafter, the main body 2 is rotated in an anti-clockwise direction by a specified angle (in the configuration shown in FIG. 2, 135°) from the second position. The die $3_{a2}$ moved from the second position to this position is called as "die $3_{a3}$". In this position (hereinbelow referred to as "third position"), the upper compaction member 5 rises up and the lower compaction member 6 further rises up by a smaller amount of movement than that of the upper compaction member 5 so that the compact Q2 is separated from the cavity 31 of the die $3_{a3}$. Thus, the compact Q2 is moved to the second flow passage member 7 by the rotation of the main body 2 in a state that the compact Q2 is separated from the cavity 31. As a result, the compact Q2 passes through the second flow passage member 7 to thereby be discharged to an outside of the compact production apparatus 1. In this regard, the movement of the compact Q2 to the second flow passage member 7 is performed by using, e.g., a scraper.

In the compact production apparatus 1, portions below are constituted of a nonmetallic material.

The upper surface 23 of the main body 2

The inner circumferential surface 32 of the die 3

The upper punch surface 52 of the upper compaction member 5

The lower punch surface 62 of the lower compaction member 6

The inner circumferential surface 43 of the first flow passage member 4

The inner circumferential surface 71 of the second flow passage member 7

At least 80% or more of a total surface area of the above portions is constituted of the nonmetallic material, and it is preferred that 100% of the total surface area of the above portions is constituted of the nonmetallic material.

In addition, it is preferred that a surface of the scraper exemplified above is constituted of the nonmetallic material.

As shown in FIGS. 3 to 5, each of the upper surface 23 of the main body 2, the inner circumferential surface 32 of the die 3, the upper punch surface 52 of the upper compaction member 5, the lower punch surface 62 of the lower compaction member 6, the inner circumferential surface 43 of the first flow passage member 4 and the inner circumferential surface 71 of the second flow passage member 7 is a portion which makes contact with the resin powder Q1 or the compact Q2 (hereinbelow, all of these portions are together referred to as "contact portion 10")

In a case in which the contact portion 10 is constituted of the nonmetallic material, even if fragments of the contact portion 10 are produced by friction between one part of the contact portion 10 and the other part thereof and/or between either the resin powder Q1 or the compact Q2 and the contact portion 10 during producing the compact Q2 from the resin powder Q1, the fragments of the contact portion 10 are obviously constituted of the nonmetallic material. In contrast, in a case in which the contact portion 10 is constituted of a metallic material, if metal powder is produced by the friction between one part of the contact portion 10 and the other part thereof and/or between either the resin powder Q1 or the compact Q2 and the contact portion 10 during producing the compact Q2 from the resin powder Q1, the metal powder is contained in the compact Q2. However, in the compact production apparatus 1, it is possible to prevent the metal powder from being contained in the compact Q2 (an increased metal content contained in the compact Q2 is lowered equal to or less than 1.0 wt ppm, preferably equal to or less than 0.1 wt ppm.). In addition, even if the fragments of the contact portion 10 are contained in the compact Q2, the compact Q2 has satisfactory properties for producing the molding portion 902 of the semiconductor package 900 because the fragments of the contact portion 10 are constituted of the nonmetallic material.

Examples of such nonmetallic material include a ceramic material and resin material. It is especially preferable to use the ceramic material. The ceramic material is not particularly limited to a specific material. Examples of such ceramic material include an oxide ceramic such as an alumina, a silica, a titania, a zirconia, a yttria or a calcium phosphate, a nitride ceramic such as a silicon nitride, an aluminum nitride, a titanium nitride or a boron nitride, a carbide ceramic such as a tungsten carbide or the like, and a composite ceramic containing a combination of two or more of the above ceramic materials. Among the above ceramic materials, it is preferable to use the ceramic material containing the oxide ceramic. This makes it possible for the contact portion 10 to have excellent abrasion resistance.

In a case in which the contact portion 10 is constituted of the oxide ceramic, a Vickers hardness Hv defined by JIS Z 2244 of the oxide ceramic (nonmetallic material) measured at a load of 500 gf is not limited to a specific value, but is preferably equal to or more than 1300, is more preferably in the range of 1500 to 1700. This makes it possible for the contact portion 10 to have more excellent abrasion resistance. Examples of such an oxide ceramic having the Vickers hardness Hv within the above range include the zirconia and a high-purity alumina.

Further, in the case where the upper surface 23 of the main body 2 is to be constituted of the ceramic material, a coating film 24 containing the ceramic material may be used (see FIGS. 3 and 4). In the same way, in the case where the inner circumferential surface 32 of the die 3 is to be constituted of the ceramic material, a coating film 33 containing the ceramic material may be used (see FIGS. 3 and 4). In the case where the upper punch surface 52 of the upper compaction member 5 is to be constituted of the ceramic material, a coating film 53 containing the ceramic material may be used (see FIG. 4). In the case where the lower punch surface 62 of the lower compaction member 6 is to be constituted of the ceramic material, a coating film 63 containing the ceramic material may be used (see FIGS. 3 and 4). In the case where the inner circumferential surface 43 of the first flow passage member 4 is to be constituted of the ceramic material, a coating film 44 containing the ceramic material may be used (see FIG. 3). In the case where the inner circumferential surface 71 of the second flow passage member 7 is to be constituted of the ceramic material, a coating film 72 containing the ceramic material may be used (see FIG. 5). In these cases, the other parts than the coating film containing the ceramic material in each of the members may be constituted of, e.g., a metallic material. Further, instead of using such a coating film containing the ceramic material, the whole of each of the main body 2, die 3, the upper compaction member 5, the lower compaction member 6, the first flow passage member 4 and the second flow passage member 7 may be constituted of the nonmetallic material such as the ceramic material.

In this configuration, the contact portion 10 can be easily and reliably constituted of the ceramic material.

In this regard, a thickness of the coating films 24, 33, 53, 63, 44 and 72 is not particularly limited to a specific value, but is preferably in the range of 0.2 to 1 mm, and more preferably in the range of 0.3 to 0.5 mm. Further, the thickness of each of the coating films may be equal to or different from one another. In the case where the thickness of each of the coating films is equal to one another, for example, a condition of a device for forming the coating films can be set to equal to one another, thereby easily forming the coating films. Further, taking into consideration of an extent of the abrasion of each of the members, the thickness of the coating films may be set depending on the extent of the abrasion. For example, the thickness of the surface to be loaded such as the coating film 53 of the upper punch surface 52 or the coating film 63 of the lower punch surface 62 may be increased compared to the thickness of the coating films 24, 33 and 44. This makes it possible to secure strength of the coating films 53 and 63. Further, this also makes it possible to use such members for a long period of time without replacement thereof.

Further, it is preferred that the coating films 24 (upper surface 23) of the main body 2, the coating films 33 (inner circumferential surface 32) of the die 3, the coating films 53 (upper punch surface 52) of the upper compaction member 5 and the coating films 63 (lower punch surface 62) of the lower compaction member 6 are constituted of the same ceramic material (nonmetallic material), e.g., the zirconia. The zirconia has excellent fracture toughness among ceramic materials. As a result, by using the zirconia as a constituent material of the above portions rotating and/or sliding, it is possible to prevent the coating films from being damaged.

Further, in the case where each of the coating film 33 of the die 3, the coating film 53 of the upper compaction member 5 and the coating film 63 of the lower compaction member 6 is constituted of the ceramic material, fine irregularities may be formed on each of the above surfaces (coating films). In such a case, since the releasing agent is retained with the fine irregularities of the surfaces, an amount of the releasing agent applied to the surfaces per one application thereof can be relatively increased. This makes it possible to relatively reduce a number of the application of the releasing agent to the surfaces.

Further, the coating film 44 (inner circumferential surface 43) of the first flow passage member 4 and the coating film 72 (inner circumferential surface 71) of the second flow passage member 7 are constituted of the same or different nonmetallic material. In the case where the coating films 44 and 72 are constituted of the same nonmetallic material, from a view point of increasing strength and anti-abrasion property of the coating films 44 and 72, the coating films 44 and 72 may be constituted of the zirconia. On the other hand, in the case where the coating films 44 and 72 are constituted of different nonmetallic material, a constituent material of the coating films 44 and 72 may be selected depending on a load applied to the coating films 44 and 72. For example, the coating film 44 may be constituted of the zirconia and the coating film 72 may be constituted of Nylon. Further, the constituent material of the coating films 44 and 72 may be selected appropriately depending on a specification of the compact production apparatus 1. Furthermore, in the case where the coating films 44 and 72 are constituted of the different nonmetallic material, the compact production apparatus 1 has an advantage to facilitate workability for producing the compact Q2 due to, e.g., reduction of powder adhesion and clogging, or weight saving of the compact production apparatus 1.

While the descriptions are made on the compact production apparatus and the method for producing the compact according to the present invention shown in the drawings, the present invention is not limited thereto. Each component constituting the compact production apparatus may be substituted for an arbitrary component having the same function as it. Further, arbitrary structures also may be added thereto.

While the number of the dies provided in the main body of the compact production apparatus according to the present invention is eight in the configuration shown in the drawings, the present invention is not limited thereto. The number of the dies is one, two, three, four, five, six, seven or equal to or more than nine.

While each of the upper punch surface of the upper compaction member and the lower punch surface of the lower compaction member of the compact production apparatus according to the present invention is formed into the planar shape in the configuration shown in the drawings, the present invention is not limited thereto. Both of the upper punch surface and the lower punch surface may be formed into a curved concave shape. Further, one of the upper punch surface and the lower punch surface may be formed into the planar shape and the other may be formed into a curved concave shape.

Further, the upper compaction member, the lower compaction member and the die may be configured to be capable of modifying the size thereof (that is, the size of the compact Q2). Namely, the upper compaction member, the lower compaction member and the die may be configured to be removable from the compact production apparatus.

While the first flow passage member of the compact production apparatus according to the present invention constitutes the tubular body having the circular shape in cross section, the present invention is not limited thereto. For, example, the first flow passage member may constitute a tubular body having a semi-circular shape in cross section like the second flow passage member.

While the second flow passage member of the compact production apparatus according to the present invention constitutes the tubular body having the semi-circular shape in cross section, the present invention is not limited thereto. For, example, the second flow passage member may constitute a tubular body having a circular shape in cross section like the first flow passage member.

INDUSTRIAL APPLICABILITY

With the present invention, a portion which makes contact with the resin composition or the compact (hereinbelow, the portion is referred to as "contact portion") is constituted of the nonmetallic material. Even if fragments of the contact portion are produced by friction between one part of the contact portion and the other part thereof and/or between either the resin composition or the compact and the contact portion during producing the compact from the resin composition, the fragments of the contact portion are obviously constituted of the nonmetallic material. In contrast, in a case in which the contact portion is constituted of a metallic material, if metal powder is produced by the friction between one part of the contact portion and the other part thereof and/or between either the resin composition or the compact and the contact portion during producing the compact from the resin composition, the metal powder is contained in the compact. However, in the compact production apparatus according to the present invention, it is possible to prevent the metal powder from being contained in the compact. For the reasons stated above, the present invention is industrially applicable.

What is claimed is:

1. A compact production apparatus for producing a compact by compression-molding a resin composition which is a base material of the compact, the compact production apparatus comprising:
    a main body formed into a plate shape and configured to be rotatable around a central vertical axis thereof, the main body having at least one molding die in which a cavity having an upper opening and a lower opening vertically opposite to the upper opening is formed, the resin composition being supplied into the cavity, a first flow passage member formed into a tubular shape and constituting a first flow passage through which the resin composition is supplied into the cavity, the resin composition being supplied into the cavity through the first flow passage at a first position where the main body is rotated around the central vertical axis by a specified angle from an initial position, an upper compaction member having an upper punch surface to be inserted into the upper opening of the cavity from an upper side thereof at a second position where the main body is rotated around the central vertical axis by a specified angle from the first position, the upper punch surface allowed to compress the resin composition in the cavity, a lower compaction member having a lower punch surface to be inserted into the lower opening of the cavity from a lower side thereof at the second position, the lower punch surface allowed to compress the resin composition in the cavity in cooperation with the upper punch surface of the upper compaction member to thereby produce the compact, and a second flow passage member formed into a tubular shape and constituting a second flow passage through which the compact is discharged from the cavity, wherein the compact obtained by compressing the resin composition is separated from the cavity at a third position where the main body is rotated around the central vertical axis by a specified angle from the second position and then the compact separated from the cavity is discharged through the second flow passage, wherein at least 80% or more of a total surface area of an upper surface of the main body, an inner circumferential surface defining the cavity, an inner circumferential surface of the first flow passage member, an inner circumferential surface of the second flow passage member, the upper punch surface of the upper compaction member and the lower punch surface of the lower compaction member is constituted of a nonmetallic material, and wherein the upper surface of the main body is constituted of a coating film containing the nonmetallic material.

2. The compact production apparatus as claimed in claim 1, wherein the nonmetallic material is a ceramic material or a resin material.

3. The compact production apparatus as claimed in claim 2, wherein the ceramic material contains an oxide ceramic.

4. The compact production apparatus as claimed in claim 1, wherein a Vickers hardness Hv defined by JIS Z 2244 of the nonmetallic material measured at a load of 500 gf is equal to or more than 1300.

5. The compact production apparatus as claimed in claim 1, wherein the upper surface of the main body, the inner circumferential surface defining the cavity, the upper punch surface of the upper compaction member and the lower punch surface of the lower compaction member are constituted of the same nonmetallic material.

6. The compact production apparatus as claimed in claim 1, wherein the inner circumferential surface of the first flow passage member and the inner circumferential surface of the second flow passage member are constituted of the same or different nonmetallic material.

7. The compact production apparatus as claimed in claim 1, wherein the inner circumferential surface defining the cavity, the inner circumferential surface of the first flow passage member, the inner circumferential surface of the second flow passage member, the upper punch surface of the upper compaction member and the lower punch surface of the lower compaction member are constituted of a coating film containing the nonmetallic material.

8. The compact production apparatus as claimed in claim 7, wherein a thickness of the coating film is in the range of 0.2 to 1.0 mm.

9. The compact production apparatus as claimed in claim 1, wherein the cavity is formed into a cylindrical shape.

10. The compact production apparatus as claimed in claim 1, wherein each of the upper punch surface of the upper compaction member and the lower punch surface of the lower compaction member is formed into a planar shape or a curved concave shape.

11. The compact production apparatus as claimed in claim 1, wherein at least a part of each of the inner circumferential surface of the first flow passage member and the inner circumferential surface of the second flow passage member is inclined downwardly.

12. The compact production apparatus as claimed in claim 1, further comprising a releasing agent layer, wherein the releasing agent layer is formed by applying a releasing agent to each of the inner circumferential surface defining the cavity, the upper punch surface of the upper compaction member and the lower punch surface of the lower compaction member.

13. A method for producing a compact by compression-molding a resin composition which is a base material of the compact using the compact production apparatus defined by claim 1, said method comprising:
    supplying the resin composition from the first flow passage of the first flow passage member into the cavity of the molding die of the main body at the first position,
    compressing the resin composition in the cavity between the upper punch surface of the upper compaction member and the lower punch surface of the lower compaction member at the second position to thereby produce the compact, and
    discharging the compact from the cavity through the second flow passage of the second flow passage member at the third position.

14. The compact production apparatus as claimed in claim 2, wherein the main body, the upper compaction member, the lower compaction member, the first flow passage member and the second flow passage member are constituted of the ceramic material.

15. The compact production apparatus as claimed in claim 7, wherein at least one of the coating films constituting the upper punch surface and the lower punch surface is thicker than the coating films constituting the upper surface of the main body, the inner circumferential surface defining the cavity, and the inner circumferential surfaces of the first flow passage member and the second flow passage member.

* * * * *